(12) United States Patent
Downs et al.

(10) Patent No.: US 11,109,503 B1
(45) Date of Patent: Aug. 31, 2021

(54) DATA CONNECTION APPARATUS AND SUPPORTING APPARATUS

(71) Applicant: EATON INTELLIGENT POWER LIMITED, Dublin (IE)

(72) Inventors: John E. Downs, Hopedale, OH (US);
Charles M. Wertz, Gibsonia, PA (US);
Theodore J. Miller, Oakdale, PA (US);
Taoufik Sekkat, Oak Creek, WI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 38 days.

(21) Appl. No.: 16/783,466

(22) Filed: Feb. 6, 2020

(51) Int. Cl.
*H05K 1/00* (2006.01)
*H05K 1/18* (2006.01)
*H05K 7/00* (2006.01)
*H05K 7/14* (2006.01)
*H05K 1/11* (2006.01)

(52) U.S. Cl.
CPC ........... *H05K 7/1454* (2013.01); *H05K 1/111* (2013.01); *H05K 1/181* (2013.01)

(58) Field of Classification Search
CPC ....... H05K 7/1454; H05K 1/111; H05K 1/181
See application file for complete search history.

(56) References Cited

U.S. PATENT DOCUMENTS

| | | | | |
|---|---|---|---|---|
| 4,112,269 A | * | 9/1978 | Nelson | H02B 11/133 200/50.26 |
| 4,206,329 A | * | 6/1980 | Jarosz | H01H 9/22 200/50.26 |
| 4,281,227 A | * | 7/1981 | Rexroad | H02B 11/02 200/50.21 |
| 4,565,908 A | * | 1/1986 | Bould | H02B 11/24 200/50.22 |
| 6,315,589 B1 | | 11/2001 | Inniss et al. | |
| 8,383,970 B2 | * | 2/2013 | Pawar | H02B 11/127 200/50.21 |
| 9,261,230 B2 | * | 2/2016 | Engelvin | H05K 7/1454 |

(Continued)

OTHER PUBLICATIONS

European Patent Office "International Search Report and Written Opinion", from corresponding International Application No. PCT/EP21/025036, dated May 7, 2021, 16 pp.

*Primary Examiner* — Yuriy Semenenko
(74) *Attorney, Agent, or Firm* — Eckert Seamans Cherin & Mellott, LLC

(57) ABSTRACT

A data connection apparatus of a supporting apparatus includes a stationary part and a movable part. One of the stationary and movable parts has a circuit board having a number of electrically conductive pads, and the other has a receptacle within which the circuit board is received, such as when a circuit interrupter is moved to an installed position within a cassette of a draw-out switchgear cabinet. The data connection apparatus includes a housing within which the receptacle is formed, with the housing having a plurality of electrical contacts within the receptacle. The housing and the circuit board each have relieved regions in the exemplary form of ramped surfaces and edges that facilitate reception of the circuit board in the receptacle. Moreover, the circuit board and the housing are situated on structured that afford a certain level of flexibility to further facilitate reception of the circuit board in the receptacle.

20 Claims, 3 Drawing Sheets

(56) References Cited

U.S. PATENT DOCUMENTS

| | | | |
|---|---|---|---|
| 2001/0012194 A1* | 8/2001 | Soares | H02B 11/12 |
| | | | 361/608 |
| 2005/0087430 A1 | 4/2005 | Ette et al. | |
| 2011/0214968 A1* | 9/2011 | Waynick, Sr. | H02B 11/133 |
| | | | 200/50.24 |
| 2018/0102233 A1* | 4/2018 | Miller | H01H 71/0207 |
| 2019/0026749 A1* | 1/2019 | Gao | H04B 5/0062 |
| 2019/0372256 A1 | 12/2019 | Phillips et al. | |
| 2021/0075198 A1* | 3/2021 | Monahan | H02B 1/36 |

\* cited by examiner

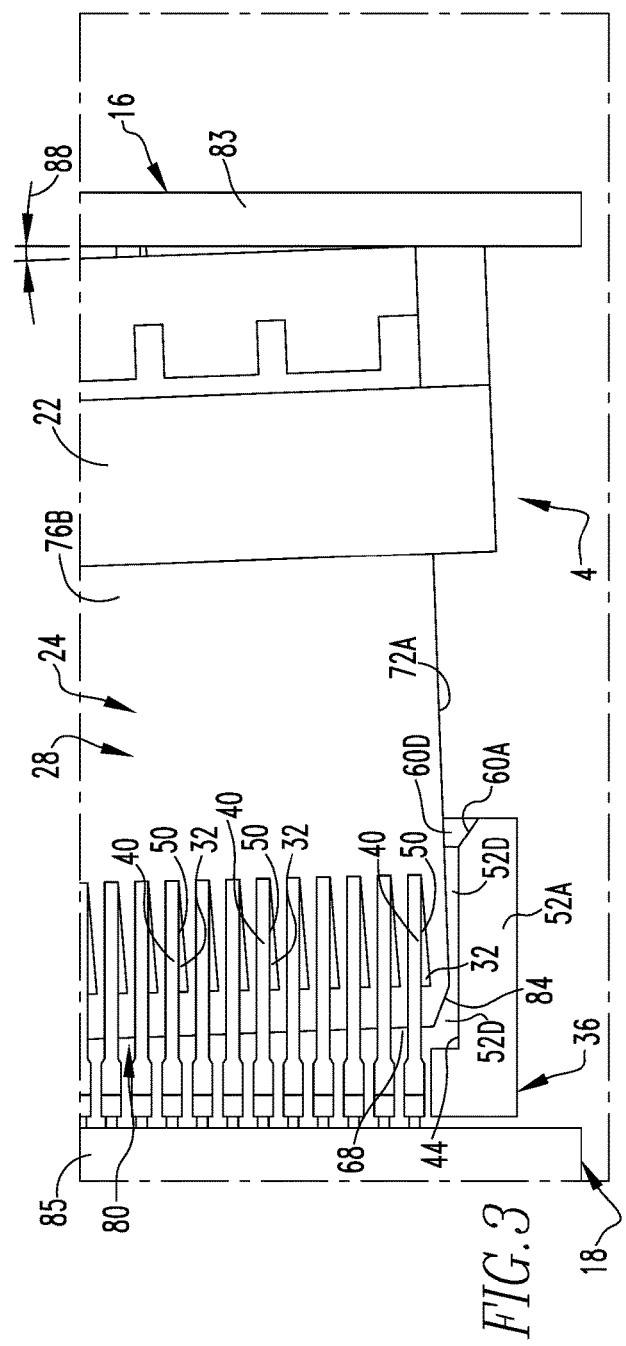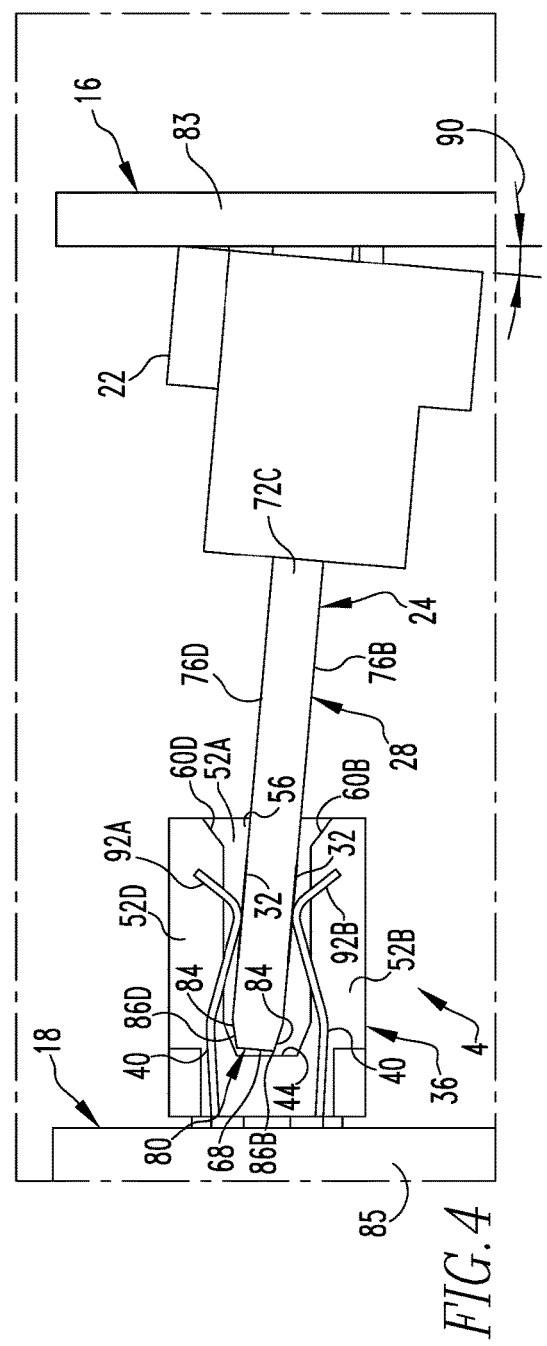

DATA CONNECTION APPARATUS AND SUPPORTING APPARATUS

BACKGROUND

Field

The disclosed and claimed concept relates generally to a data connection apparatus and, more particularly, to a data connection apparatus that is usable in conjunction with a supporting apparatus, such as a draw-out switch gear cabinet and an electrical component, such as a circuit interrupter.

Related Art

Draw-out switch gear cabinetry is well known in the relevant art. A draw-out switchgear cabinet typically includes a cabinet and a number of cassettes. Each such cassette holds a circuit interrupter that is removably received in the cassette, it being noted that the circuit interrupter is movable between an installed position received in the cassette and a removed position wherein the circuit interrupter is partially or fully withdrawn from the cassette. When the circuit interrupter is in its installed position received in the cassette, electrical connectors that are situated on the circuit interrupter make electrical contact with corresponding electrical connectors that are situated on the cabinet within the cassette. While such draw-out switchgear cabinetry has been generally effective for its intended purposes, it has not been without limitation.

Modern circuit interrupters are far more complex from an electronic perspective than circuit interrupters that were manufactured in past decades. Such electronics perform numerous functions including monitoring conditions of the circuit interrupter, monitoring conditions of the current flowing through the circuit interrupter, and monitoring other conditions. Various data connections are required for these numerous features that are provided by the circuit interrupter. Such data connections are completed by detachable electrical connectors in the cassette when the circuit interrupter is moved from its removed position to its installed position. These data connections had previously been made by pins that were received in corresponding sockets when the circuit interrupter was fully received in cassette of the switchgear cabinet. Such pins and sockets have typically had a long pitch, meaning that they were spaced apart from one another a relatively long distance that enabled the pins to be robust and to enable the pins to withstand repeated withdrawals and insertions of the circuit interrupter out of and back into the cassette of the switchgear cabinet.

However, with the large number of data connections that are required with modern circuit interrupters, and with the limited spaced available within draw-out switchgear cabinetry, the pins that form the electrical connections have progressively been made to have a shorter pitch between them, meaning that the distance between such pins was relatively smaller. Such pins with relatively shorter pitch were also made relatively thinner and less robust in order to accommodate all of the needed electrical connections between a circuit interrupter and the switchgear cabinet. Such pins, being relatively smaller and less robust, have sometimes become bent during a misaligned insertion of a circuit breaker into a cassette, which has caused damage to the draw-out switchgear cabinetry, which is undesirable. Improvements thus would be preferred.

SUMMARY

An improved data connection apparatus that is usable as part of a supporting apparatus includes a stationary part and a movable part. One of the stationary part and the movable part has a circuit board having a number of pads that are electrically conductive, and the other has a receptacle within which the circuit board is received, such as when a circuit interrupter is moved to an installed position received within a cassette of a draw-out switchgear cabinet. The data connection apparatus includes a housing within which the receptacle is formed, with the housing having a plurality of electrical contacts that are situated within the receptacle. The housing and the circuit board each have relieved regions in the exemplary form of ramped surfaces and edges that facilitate reception of the circuit board in the receptacle. Moreover, the circuit board and the housing are situated on structures that afford a certain level of flexibility to further facilitate reception of the circuit board in the receptacle.

Accordingly, an aspect of the disclosed and claimed concept is to provide an improved data connection apparatus having a circuit board that is removably received in a receptacle to form a number of electrical connections between the circuit board and the receptacle. As employed herein, the expression "a number of" and variations thereof shall refer broadly to any non-zero quantity, including a quantity of one.

Another aspect of the disclosed and claimed concept is to provide an improved supporting apparatus having such a data connection apparatus and including a stationary part and a movable part, with the movable part being movable with respect to the stationary part, such as may be employed in a draw-out switchgear cabinet or in any other type of device that makes and breaks electrical connections when a movable part is moved with respect to a stationary part.

Another aspect of the disclosed and claimed concept is to provide such a data connection apparatus that includes a circuit board having a plurality of pads that are electrically conductive and a housing having a receptacle within which the circuit board is receivable, with the housing having a number of electrical contacts that are situated within the receptacle and that make electrical connections with the pads when the circuit board is received in the receptacle.

Another aspect of the disclosed and claimed concept is to provide such an improved data connection apparatus that provides a high density of data connections and that enables megabit speeds to be maintained because the data connection apparatus mimics a proper transmission line and provides common mode noise immunity.

Accordingly, an aspect of the disclosed and claimed concept is to provide an improved data connection apparatus that is usable in connection with a supporting apparatus and an electrical component, the supporting apparatus being structured to support the electrical component, the electrical component being movable with respect to the supporting apparatus between a first position and a second position. The data connection apparatus can be generally stated as including a first component structured to be situated on one of the supporting apparatus and the electrical component, the first component can be generally stated as including a support and a circuit board, the circuit board being situated on the support, the circuit board having an exterior surface and further having a plurality of pads that are electrically conductive and are situated on the exterior surface, and a second component structured to be situated on the other of the supporting apparatus and the electrical component, the second component can be generally stated as including a housing and a plurality of electrical contacts, the plurality of electrical contacts being situated on the housing, the housing having a receptacle which, in the first position, is structured to receive therein at least a portion of the circuit board with at least a subset of the electrical contacts of the plurality of electrical contacts being engaged with and being electrically connected with at least a subset of the pads of the plurality of pads, the receptacle being structured to have the at least portion of the circuit board removed therefrom in the second position.

Another aspect of the disclosed and claimed concept is to provide an improved combination that can be generally stated as including a supporting apparatus, an electrical component that is movable with respect to the supporting apparatus between a first position and a second position, and a data connection apparatus that can be generally stated as including a first component and a second component, the first component being situated on one of the supporting apparatus and the electrical component, the first component can be generally stated as including a support and a circuit board, the circuit board being situated on the support, the circuit board having an exterior surface and further having a plurality of pads that are electrically conductive and are situated on the exterior surface, and the second component being situated on the other of the supporting apparatus and the electrical component, the second component can be generally stated as including a housing and a plurality of electrical contacts, the plurality of electrical contacts being situated on the housing, the housing having a receptacle which, in the first position, receives therein at least a portion of the circuit board with at least a subset of the electrical contacts of the plurality of electrical contacts being engaged with and being electrically connected with at least a subset of the pads of the plurality of pads, the receptacle having the at least portion of the circuit board removed therefrom in the second position.

BRIEF DESCRIPTION OF THE DRAWINGS

A further understanding of the disclosed and claimed concept can be gained from the following Description when read in conjunction with the accompanying drawings in which:

FIG. 3 is a side elevational view of a portion of the data connection apparatus of FIG. 2;

FIG. 4 is a top plan view of a portion of the data connection apparatus of FIG. 2; and FIG. 5 is an enlargement of an indicated portion of FIG. 1.

Similar numerals refer to similar parts throughout the specification.

DESCRIPTION

Figure 1:
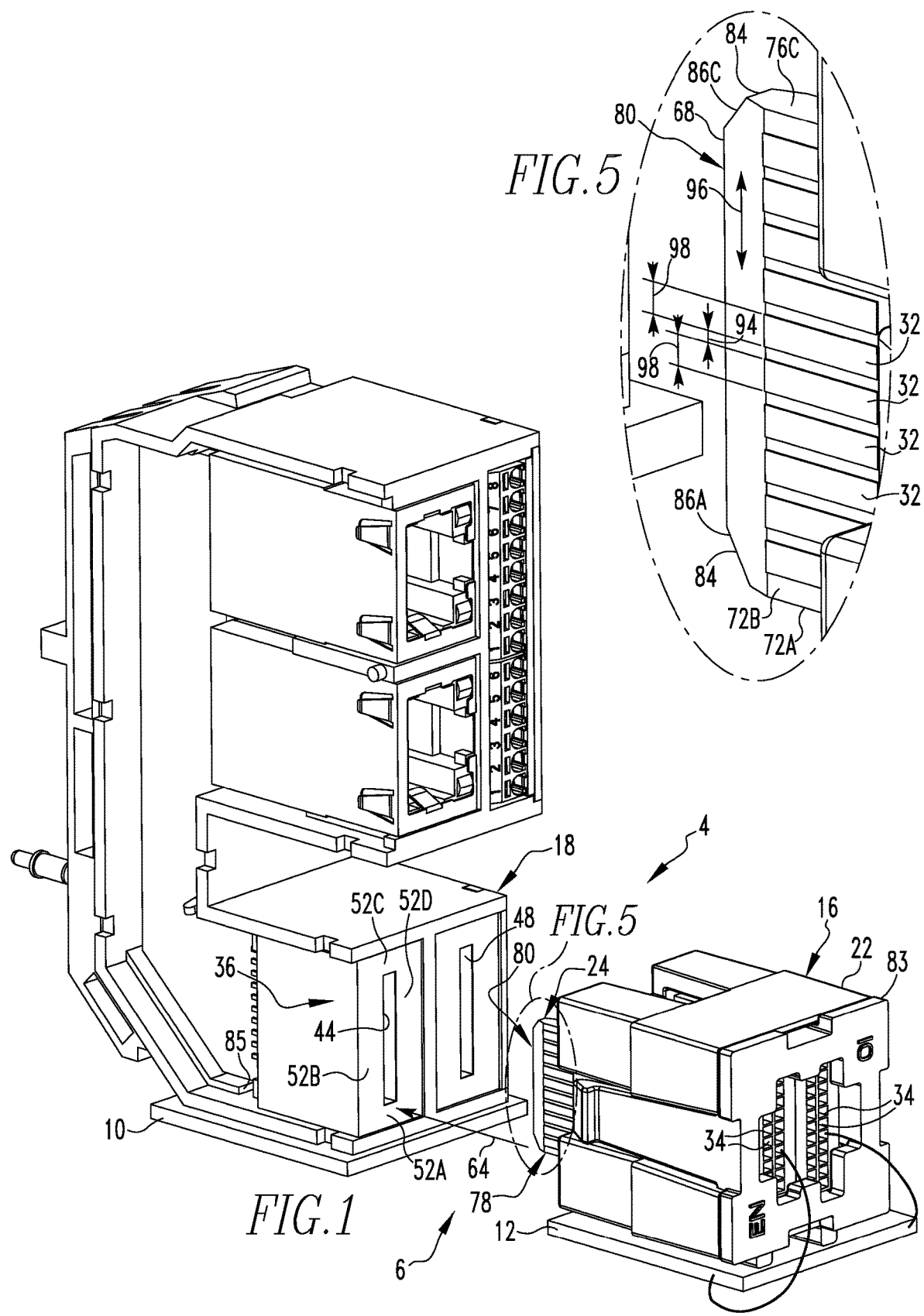
FIG. 1 is a perspective view of an improved data connection apparatus in accordance with the disclosed and claimed concept and an improved combination in accordance with the disclosed and claimed concept having a supporting apparatus and an electrical component in a position wherein a first component and a second component of the data connection apparatus are electrically disconnected from one another.
Figure 2:
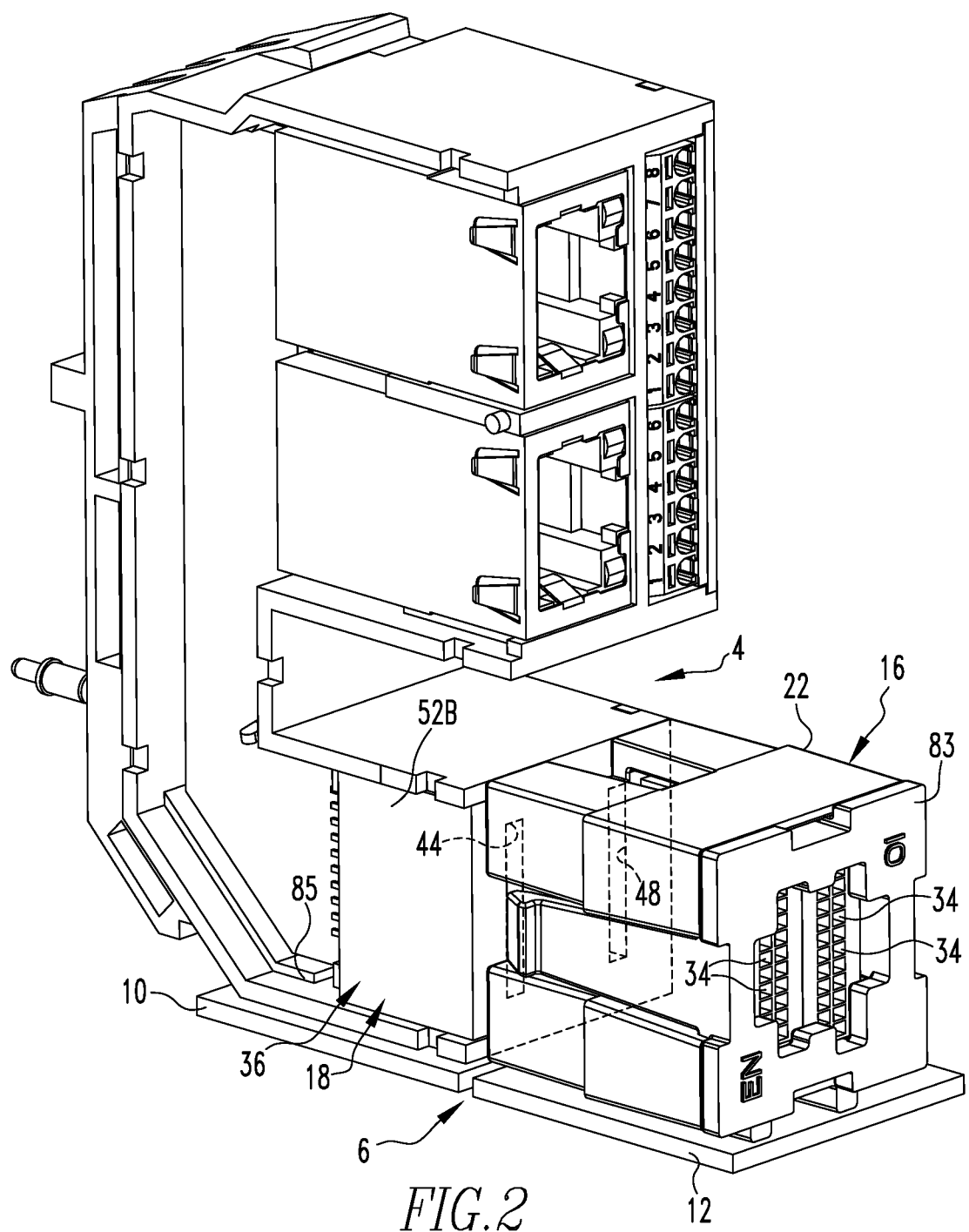
FIG. 2 is a view similar to FIG. 1, except depicting the first and second components in another position wherein they are electrically connected together.

An improved data connection apparatus 4 in accordance with the disclosed and claimed concept is depicted generally in FIGS. 1 and 2. The data connection apparatus 4 is part of an improved combination 6 that is likewise in accordance with the disclosed and claimed concept. The combination 6 can be said to include a supporting apparatus 10 and an electrical component 12, with the electrical component 12 being movable with respect to the supporting apparatus 10 between a first position, such as is depicted generally in FIG. 2, and a second position, such as is depicted generally in FIG. 1. In the depicted exemplary embodiment of the combination 6, the supporting apparatus 10 may be, for example and without limitation, a draw-out cassette, and the electrical component 12 may be, for example and without limitation, a circuit interrupter that is movable with respect to the exemplary cassette that forms the supporting apparatus 10.

The data connection apparatus 4 can be said to include a first component 16 which, in the depicted exemplary embodiment, is situated on the electrical component 12. The data connection apparatus 4 further includes a second component 18 which, in the depicted exemplary embodiment, is situated on the supporting apparatus 10. It is further understood that the first component 16 is situated on the electrical component 12 and is movable with the electrical component 12 between the first and second positions that are depicted in FIGS. 2 and 1, respectively, by way of example. It is also understood that the combination 6 can be any of a wide variety of other types of devices other than draw-out cassettes and circuit interrupters that provide a movable component, such as the exemplary first component 16, and a stationary component, such as the exemplary second component 18, that make and break electrical connections depending upon the position of the movable component with respect to the stationary component.

As can be understood from FIG. 1, the first component 16 can be said to include a support 22 that is situated on the electrical component 12 and to further include a circuit board 24 that is situated on the support 22. The circuit board 24 includes an exterior surface 28 and a plurality of pads 32 that are situated on the exterior surface and that are electrically conductive. The circuit board 24 can be any of a wide variety of electrical boards that are relatively rigid, such as printed circuit boards and other boards. The exemplary first component 16 that is depicted in FIG. 1 includes both the circuit board 24 and another circuit board that is identical to circuit board 24 but that is situated behind circuit board 24 and thus cannot be seen from the angle of the first component 16 that is depicted in FIG. 1. The pads 32 of the circuit board 24 and of the other circuit board that is not visible in FIG. 1 are each electrically connected with a plurality of sockets that are indicated at the numeral 34 and that receive therein pins of electrical leads that are connectable with the circuit interrupter 14.

As can further be seen in FIG. 1, the second component 18 can be said to include a housing 36 that is situated on the supporting apparatus 10 and that has a plurality of electrical contacts 40 situated thereon. The housing has a receptacle 44 formed therein. The electrical contacts 40 are, as a general matter, situated within the receptacle 44, such as is depicted generally in FIGS. 3 and 4. As can further be seen in FIGS. 1 and 2, the housing 36 includes another receptacle 48 that is structured to receive therein the circuit board that is not visible from FIG. 1 but that is similar to the circuit board 24. The second component 18 likewise includes a plurality of electrical contacts similar to the electrical contacts 40 and that are situated within the receptacle 48. When the circuit board 24 is received in the receptacle 44, the electrical contacts 40 are biased toward the circuit board 24 and are engaged with and form with the pads 32 a number of electrical connections, some of which are indicated at the numeral 50 in FIG. 3.

That is, the first component 16, being disposed on the electrical component 12, can be situated in a first position that is depicted generally in FIG. 2 wherein the circuit board 24 is received in the receptacle 44 and the electrical contacts 40 form the electrical connections 50 with the pads 32 to thereby electrically connect together the first and second components 16 and 18. This occurs in an installed position of the combination 6 which, as noted hereinbefore, is in the exemplary but non-limiting form of a circuit interrupter installed in a draw-out cassette, and which can be any of a wide variety of other types of electrical devices. The data connection apparatus 4 is movable between the first position of FIG. 2 and a second position of FIG. 1 wherein the circuit board 24 is removed from the receptacle 44, thus breaking the electrical connections 50 that had been formed between the electrical contacts 40 and the pads 32. This occurs when the electrical component 12 is partially or fully removed from the supporting apparatus 10. Such movement between the first and second positions of FIGS. 2 and 1, respectively, can be performed without a meaningful concern of damage to the data connection apparatus 4 since the circuit board 24 is itself relatively robust and is resistant to bending and breakage, which is advantageous. Moreover, the circuit board 24 and the housing 36 in the vicinity of the receptacle 44 both have relieved regions that facilitate self-alignment between the circuit board 24 and the receptacle 44 in order to facilitate reception of the circuit board 24 in the receptacle 44 and to facilitate the electrical connections 50 being formed therebetween. Further advantageously, the structures upon which the support 22 and the housing 36 are situated afford a certain amount of physical flexibility for the circuit board 24 and the housing 36 which further permits self-alignment therebetween.

As can be understood from the accompanying drawings, the housing 36 can be said to include a plurality of walls that are indicated at the numerals 52A, 52B, 52C, and 52D, which may be collectively or individually referred to herein with the numeral 52, that are each situated adjacent the receptacle 44. The walls 52 together form a mouth 56 of the receptacle 44 that is in the form of a widened mouth that comprises a relieved surface on each of the walls 52 in the vicinity of the mouth 56. More specifically, FIG. 3 depicts a relieved surface 60A on the wall 52A, and it can be understood from FIG. 3 that the relieved surface 60A is a ramped insertion surface that is an interior surface of the receptacle 48. Similarly, FIG. 4 depicts the walls 52B and 52D each having a relieved surface indicated at the numerals 60B and 60D, respectively, that likewise are ramped insertion surfaces that are interior surfaces of the receptacle 44. It is understood that the wall 52C likewise has a relieved surface in the form of a ramped insertion surface that is an interior surface of the receptacle 44 and that is a mirror image of the relieved surface 60A in FIG. 3.

The exemplary relieved surfaces 60A, 60B, and 60D are described herein as being ramped insertion surfaces, meaning that they each are of flat surface that is oriented oblique to, for instance, an insertion direction that is indicated at the numeral 64 in FIG. 1. It is understood, however, that the various relieved surfaces could be of other configurations without departing from the spirit of the instant disclosure. For instance, the relieved surfaces could be of an arcuate profile, whether of fixed radius or varying radius. Furthermore, the relieved surfaces could be of a ramped profile but at angles other than what are depicted in the accompanying drawings with respect to the insertion direction 64. Still alternatively, and by way of example, the relieved surfaces could be combinations of arcuate and ramped profiles, without limitation, and by way of example, and they need not all be of the same profile and rather could each be of different profiles depending upon the needs of the application. The widened mouth 56 that is afforded by the relieved surfaces 60A, 60B, and 60D (and the relieved surface of the wall 52C) together facilitate reception of the circuit board 24 in the receptacle 44 when the electrical component 12 is in the first position.

It can further be understood that the exterior surface 28 of the circuit board 24 actually is a plurality of surfaces that are generally indicated at the numeral 78 and that include an end surface 68 at the free end of the circuit board 24, a pair of edge surfaces 72A and 72C, and a pair of main surfaces 76B and 76D. It is noted that the aforementioned plurality of surfaces 78, i.e., the end surface 68, the edge surfaces 72A and 72C, and the main surfaces 76B and 76D, are situated generally adjacent one another. Furthermore, it is noted that the pads 32 are situated on the main surfaces 76B and 76D but could be situated on other of the plurality of surfaces 78 depending upon the needs of the application.

The circuit board 24 can be said to include an end 80 opposite the support 22 that is in the form of a narrowed end that comprises a number of relieved regions that are situated adjacent at least a subset of the surfaces among the plurality of surfaces 78. For instance, the number of relieved regions can be indicated at the numeral 84 and can be said to be situated generally at the free end of the circuit board 24 opposite the support 22 and generally in the vicinity of the end surface 68. The depicted exemplary embodiment, the relieved regions 84 can be said to include a plurality of exemplary ramped insertion regions that are in the exemplary form of angled surfaces that are indicated at the numerals 86A, 86B, 86C, and 86D, and which may be collectively or individually referred to herein with the numeral 86. The ramped insertion regions 86A and 86C are situated adjacent the edge surfaces 72A and 72C, respectively. In a like fashion, the ramped insertion regions 86B and 86D are situated adjacent the main surfaces 76B and 76D, respectively.

While the relieved regions 84 are each depicted in the exemplary form of the angled surfaces represented by the ramped insertion regions 86, it is understood that the relieved regions 84 could alternatively be of arcuate profiles, ramped profiles of different angles, or combinations thereof, without departing from the spirit of the instant disclosure. Moreover, the relieved regions 84 need not all be of the same profile. It thus can be understood that the ramped insertion regions 86 that are the exemplary form of the relieved regions 84 that are at the narrowed end of the circuit board 24 facilitate insertion of the circuit board 24 into the receptacle 44, and such insertion is further aided by the relieved surfaces of the widened mouth 56 of the receptacle 44.

It is additionally understood that the reception of the circuit board 24 in the receptacle 44 is further aided by flexibility that inherently exists in the first and second components 16 and 18. For instance, FIGS. 3 and 4 depict the support 22 of the first component 16 being mounted to a platform that is indicated at the numeral 83. FIG. 3 depicts at the numeral 88 an angular departure between the support 22 and the platform 83 in a first plane. FIG. 4 similarly depicts at the numeral 90 another angular departure between the support 22 and the platform 83 in a different plane, orthogonal to the plane of FIG. 3. Such angles 88 and 90 are greatly exaggerated and are intended to demonstrate and exemplify that the circuit board 24 is situated on the electrical component 12 with at least a nominal level of flexibility that enables the circuit board 24 to pivot slightly when it is being received in the receptacle 44. While the angles 88 and 90 depict flexibility between the circuit board 24 and the platform 83, it is understood that the angles 88 and 90 are more specifically intended to depict elastic deformation of all structures between the electrical component 12 and the circuit board 24 that enable such pivoting movement of the circuit board 24. Furthermore, it is understood that the housing 36 is situated on a base that is indicated at the numeral 85, and it is understood that the base 85 likewise affords to the housing 36 a similar level of flexibility such that the housing 36 is movable by at least a nominal amount in a number of planes with respect to the supporting apparatus 10 when the circuit board 24 is being received in the receptacle 44.

The flexibility of the circuit board 24 with respect to the electrical component 12 and the flexibility of the housing 36 with regard to the supporting apparatus 10 together further facilitate reception of the circuit board 24 in the receptacle 44 without damage to either such component due to the slight movement of such components with respect to the supporting apparatus 10 and the electrical component 12 when the first component 16 is moved along the insertion direction 64 and is received in the mouth 56. Such flexibility promote self-alignment between the circuit board 24 and the housing 36 which contributes to the avoidance of damage to the data connection apparatus 4 when the combination 6 is moving between its removed position of FIG. 1 and its installed position of FIG. 2.

As can be understood from FIG. 4, the electrical contacts 44 are arranged in sets of opposed pairs, with one opposed pair of the electrical contacts 40 being depicted in FIG. 4 at the numerals 92A and 92B. The opposed pair 92A and 92B of the electrical contacts 40 are biased toward one another when the circuit board 24 is received in the receptacle 44. The opposed pair of electrical contacts 40 furthermore are engaged with a pair of the pads 32 and are electrically connected therewith when the circuit board 24 is received in the receptacle 44. Such arrangement of the electrical contacts 40 in the sets of opposed pairs facilitates formations of the electrical connections 50 between the electrical contacts 40 and the pads 32 of the circuit board 24 when the circuit board 24 is received in the receptacle 44.

As can be understood from FIG. 5, the pads 32 are spaced apart from one another by a spacing dimension that is indicated at the numeral 94 in FIG. 5 as measured along a direction 96. It can also be seen from FIG. 5 that the pads 32 are of a physical dimension along the direction 96, with the dimension of the pad 32 being indicated at the numeral 98. It can be seen that the dimension of the pad 98 is greater than the dimension of the space 94 therebetween. In fact, the pad dimension 98 is several times the size of the spacing 94 between the pads 32. The result is a very dense concentration of the pads 32 in a relatively small area, it being reiterated that pads 32 are formed on both of the main surfaces 76B and 76D in the depicted exemplary embodiment, and that the pads 32 are formed both on the circuit board 24 as well as the additional circuit board that is received in the receptacle 48 but that is not shown in FIG. 1.

The overall result is a large number of the electrical connections 50, as shown in FIG. 3, being formed between the first and second components 16 and 18 in the first position of the data connection apparatus 4, such as is depicted generally in FIG. 2. As noted hereinbefore, the relieved surfaces 60 and the relieved regions 84 facilitate reception of the circuit board 24 in the receptacle 44, and such reception is aided by the at least nominal flexibility of the circuit board 24 and the receptacle 44 with respect to the movable and stationary parts 12 and 10, respectively. The result is that the data connection apparatus 4 is robust and is capable of numerous receptions and removals of the circuit board 24 in the receptacle 44 to make and break the electrical connections 50 between, for instance, the circuit interrupter 14 and the combination 6, by way of example. It is further noted that the relatively tight spacing of the pads 32 advantageously promotes control of common mode noise and enables the pads 32 and the electrical contacts 40 to mimic a proper transmission line. It is understood that a proper transmission line has an impedance that appears like 100 Ohms to an AC signal regardless of what the actual circuit trace resistance value is. Such proper transmission line behavior advantageously enables digital pulses to be communicated across the data connection apparatus 4 at extremely high speeds, such as at megabit speeds, which is highly advantageous. Other advantages will be apparent.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A data connection apparatus usable in connection with a supporting apparatus and an electrical component, the supporting apparatus being structured to support the electrical component, the electrical component being movable with respect to the supporting apparatus between a first position and a second position, the data connection apparatus comprising:

a first component structured to be situated on one of the supporting apparatus and the electrical component, the first component comprising a support and a circuit board, the circuit board being situated on the support, the circuit board having an exterior surface and further having a plurality of pads that are electrically conductive and are situated on the exterior surface; and a second component structured to be situated on the other of the supporting apparatus and the electrical component, the second component comprising a housing and a plurality of electrical contacts, the plurality of electrical contacts being situated on the housing, the housing having a receptacle which, in the first position, is structured to receive therein at least a portion of the circuit board with at least a subset of the electrical contacts of the plurality of electrical contacts being engaged with and being electrically connected with at least a subset of the pads of the plurality of pads, the receptacle being structured to have the at least portion of the circuit board removed therefrom in the second position.

2. The data connection apparatus of claim 1 wherein the housing has a plurality of walls, the receptacle being adjacent the plurality of walls, the receptacle having a widened mouth comprising a relieved surface formed on each of at least a subset of the walls.

3. The data connection apparatus of claim 2 wherein the relieved surface formed on each of at least some of the walls of the at least subset of the walls is a ramped insertion surface.

4. The data connection apparatus of claim 1 wherein the exterior surface comprises a plurality of surfaces that comprise an end surface, a pair of edge surfaces, and a pair of main surfaces that are adjacent one another, the plurality of pads being situated on at least one main surface of the pair of main surfaces.

5. The data connection apparatus of claim 4 wherein the circuit board has a narrowed end opposite the support, the narrowed end comprising a relieved region formed adjacent each of at least a subset of the surfaces of the plurality of surfaces.

6. The data connection apparatus of claim 5 wherein the relieved region formed adjacent each of at least some of the surfaces of the at least subset of the surfaces is a ramped insertion region.

7. The data connection apparatus of claim 6 wherein the housing has a plurality of walls, the receptacle being adjacent the plurality of walls, the receptacle having a widened mouth comprising a relieved surface formed on each of at least a subset of the walls, the relieved surface formed on each of at least some of the walls of the at least subset of the walls being a ramped insertion surface.

8. The data connection apparatus of claim 1 wherein the plurality of electrical contacts are biased toward the circuit board when the circuit board is received in the receptacle.

9. The data connection apparatus of claim 8 wherein the plurality of electrical contacts are arranged in opposed pairs, the electrical contacts of each opposed pair being biased toward one another when the circuit board is received in the receptacle.

10. The data connection apparatus of claim 1 wherein at least a subset of the plurality of pads are spaced apart from one another along a direction, wherein a pair of pads of the at least subset of the plurality of pads are situated adjacent one another on the exterior surface and are spaced apart by a distance as measured along the direction, the pair of pads each being sized to be of a dimension as measured along the direction that is greater than the distance.

11. A combination comprising:
 supporting apparatus;
 an electrical component that is movable with respect to the supporting apparatus between a first position and a second position; and
 a data connection apparatus comprising a first component and a second component;
 the first component being situated on one of the supporting apparatus and the electrical component, the first component comprising a support and a circuit board, the circuit board being situated on the support, the circuit board having an exterior surface and further having a plurality of pads that are electrically conductive and are situated on the exterior surface; and
 the second component being situated on the other of the supporting apparatus and the electrical component, the second component comprising a housing and a plurality of electrical contacts, the plurality of electrical contacts being situated on the housing, the housing having a receptacle which, in the first position, receives therein at least a portion of the circuit board with at least a subset of the electrical contacts of the plurality of electrical contacts being engaged with and being electrically connected with at least a subset of the pads of the plurality of pads, the receptacle having the at least portion of the circuit board removed therefrom in the second position.

12. The supporting apparatus of claim 11 wherein the housing has a plurality of walls, the receptacle being adjacent the plurality of walls, the receptacle having a widened mouth comprising a relieved surface formed on each of at least a subset of the walls.

13. The supporting apparatus of claim 12 wherein the relieved surface formed on each of at least some of the walls of the at least subset of the walls is a ramped insertion surface.

14. The supporting apparatus of claim 11 wherein the exterior surface comprises a plurality of surfaces that comprise an end surface, a pair of edge surfaces, and a pair of main surfaces that are adjacent one another, the plurality of pads being situated on at least one main surface of the pair of main surfaces.

15. The supporting apparatus of claim 14 wherein the circuit board has a narrowed end opposite the support, the narrowed end comprising a relieved region formed adjacent each of at least a subset of the surfaces of the plurality of surfaces.

16. The supporting apparatus of claim 15 wherein the relieved region formed adjacent each of at least some of the surfaces of the at least subset of the surfaces is a ramped insertion region.

17. The supporting apparatus of claim 16 wherein the housing has a plurality of walls, the receptacle being adjacent the plurality of walls, the receptacle having a widened mouth comprising a relieved surface formed on each of at least a subset of the walls, the relieved surface formed on each of at least some of the walls of the at least subset of the walls being a ramped insertion surface.

18. The supporting apparatus of claim 11 wherein the plurality of electrical contacts are biased toward the circuit board when the circuit board is received in the receptacle.

19. The supporting apparatus of claim 18 wherein the plurality of electrical contacts are arranged in opposed pairs, the electrical contacts of each opposed pair being biased toward one another when the circuit board is received in the receptacle.

20. The supporting apparatus of claim 11 wherein at least a subset of the plurality of pads are spaced apart from one another along a direction, wherein a pair of pads of the at least subset of the plurality of pads are situated adjacent one another on the exterior surface and are spaced apart by a distance as measured along the direction, the pair of pads each being sized to be of a dimension as measured along the direction that is greater than the distance.

\* \* \* \* \*